United States Patent [19]
Kobayashi

[11] Patent Number: 5,512,782
[45] Date of Patent: Apr. 30, 1996

[54] SEMICONDUCTOR DEVICE FOR DC/AC CONVERTER

[75] Inventor: Shinichi Kobayashi, Nagano, Japan

[73] Assignee: Fuji Electric Co., Ltd., Kawasaki, Japan

[21] Appl. No.: 310,314

[22] Filed: Oct. 4, 1994

[30] Foreign Application Priority Data

Oct. 13, 1993 [JP] Japan .................................. 5-254614

[51] Int. Cl.⁶ .......................... H01L 23/52; H01L 23/48
[52] U.S. Cl. .................. 257/691; 257/695; 257/925; 361/805; 361/823; 363/123; 363/127
[58] Field of Search .................................. 257/691, 693, 257/925; 363/123, 127; 361/805, 823

[56] References Cited

U.S. PATENT DOCUMENTS

| | | | |
|---|---|---|---|
| 4,908,738 | 3/1990 | Kobari et al. ........................... | 361/429 |
| 4,965,710 | 10/1990 | Pelly et al. .............................. | 257/713 |
| 5,055,990 | 10/1991 | Miki et al. ................................ | 363/56 |
| 5,347,160 | 9/1994 | Sutrina .................................... | 257/691 |
| 5,365,108 | 11/1994 | Anderson et al. ...................... | 257/691 |
| 5,408,128 | 4/1995 | Furnival ................................... | 257/698 |

FOREIGN PATENT DOCUMENTS 0379346  7/1990  European Pat. Off. .

*Primary Examiner*—Rolf Hille
*Assistant Examiner*—David Ostrowski
*Attorney, Agent, or Firm*—Kanesaka & Takeuchi

[57] ABSTRACT

A semiconductor device for converting DC input power to AC output power includes a package having a rectangular shape with four side edges and containing a plurality of semiconductor chips therein. Two pairs of positive and negative terminals of DC input terminals are situated on the side edges to face to each other such that the same polar terminals in the positive and negative terminals face to each other. AC output terminals and control terminals are arranged on the side edges where the DC input terminals are not formed.

7 Claims, 3 Drawing Sheets

SEMICONDUCTOR DEVICE FOR DC/AC CONVERTER

BACKGROUND OF THE INVENTION AND RELATED ART STATEMENT

The present invention relates to a semiconductor device for power conversion, such as a VVVF inverter.

A structure of a semiconductor apparatus according to the prior art is shown in FIGS. 3(a) and 3(b), and an inverter circuit of the semiconductor device is shown in FIG. 4. In FIGS. 3(a) and 3(b), reference numeral 1 designates a package for forming the device in a rectangular shape; 2 and 3 designate positive and negative DC input terminals (P, N); 4 designates AC output terminals (U, V, W); and 5 designates a control terminal of a semiconductor chip, such as IGBT, mounted in the package 1. The terminals 2, 3, 4 and 5 are arranged on the upper surface of the package 1, as illustrated in FIGS. 3(a) and 3(b).

Inside the package 1, six pairs of semiconductor chips are mounted as shown in FIG. 4 to form a three phase bridge circuit, wherein an IGBT (insulated gate bipolar transistor) 6 as a semiconductor chip for switching and a free wheeling diode 7 are coupled together. In FIG. 4, reference numeral 8 designates a rectifier circuit of a DC power supply, and 9 designates a motor which is connected to the AC output and controlled to variable speed.

In the above structure, the speed of the motor 9 is adjusted by variably controlling the voltage and the frequency of the AC output from the AC output terminals 4 while the IGBTs 6 are switched on and off at an appropriate timing.

In this case, a main circuit current flows from the DC side to the AC side via the IGBTs 6 or from the AC side to the DC side via the IGBTs 6 and the free wheeling diodes 7 by the switching operation of the IGBTs 6. However, since the current variation rate di/dt is high at the time of high speed switching of the IGBTs 6, stray inductance 10 (inductance value L) of internal wiring on the DC side causes surge voltage L×di/dt. The surge voltage is added to the DC input voltage and is supplied to the IGBTs 6 and the free wheeling diodes 7, so that the constituent elements of the chips break down when the surge voltage exceeds the withstanding voltage of the chips. To solve this problem, snubber capacitors 11 for surge suppression are connected between the positive and negative DC input terminals 2 and 3, as shown in FIG. 4 to suppress the surge voltage caused by the stray inductance 10 of the internal wiring.

In the surge voltage protection circuit shown in FIG. 4, the snubber capacitor 11 connected between a pair of the DC input terminals 2, 3 on the far side (right side in FIG. 4) from the DC power supply shows less surge suppression than that of the capacitor 11 connected between a pair of the DC input terminals 2, 3 on the near side to the DC power supply. This problem is solved by connecting conductor bars 12 as shown in dotted lines in FIG. 4 such that one conductor bar 12 connects the positive terminals with each other and the other conductor bar 12 connects the negative terminals with each other. In this structure, the current in the DC side main circuit is divided into two paths including the conductor bars 12, so that surge voltage is suppressed more effectively.

If the above described internal arrangement is adapted to the semiconductor apparatus of FIG. 3, the bars 12 externally connected between the DC input terminals 3 can not be wired in the shortest straight distance, because the AC output terminals 4 between the DC input terminals 3 and insulative partition walls 13 disposed between the terminals obstruct straight wiring of the conductor bars 12. Thus, the conductor bars have to be made long, which increases inductance component and deteriorates surge suppression effect of the snubber capacitors 11. This problem is more serious in a larger package for a semiconductor device with a larger current capacity, because the internal wiring is longer.

In view of the foregoing, the invention has been made, and an object of the invention is to provide a semiconductor device, wherein a plurality of switching conductor chips coupled with free wheeling diode chips is arranged in a bridge circuit and installed in a package, the semiconductor device providing an especially effective terminal arrangement for suppressing the surge voltage caused by the stray inductance of the internal wiring by the combination of the snubber capacitors and the conductor bars connected between the same polar terminals in the DC input terminals.

SUMMARY OF THE INVENTION

The object of the present invention is achieved by a semiconductor device, wherein a plurality of switching semiconductor chips coupled with a plurality of free wheeling diode chips is connected to form a bridge circuit and is incorporated in a package. On an upper surface of the package in a rectangular shape containing therein the semiconductor chips, DC input terminals, AC output terminals and control terminals for various semiconductor chips are arranged. In the four side edges of the package, a pair of positive and negative terminals is situated in each of the side edges facing to each other such that the same polar terminals face to each other, and in the remaining side edges facing to each other, the AC output terminals and the control terminals are arranged.

Further, as surge voltage suppressing means for the semiconductor device, straight or linear conductor bars are formed at the outer side of the package between the positive terminals of the DC input terminals and between the negative terminals thereof. Also, in order to easily arrange the conductor bars, it is preferable to position the DC terminals on portions higher than a central area of the upper surface of the package.

In the above described structure wherein each pair of the positive and negative electrodes for the DC input terminals is arranged at each side edge of the package facing to each other, the conductor bars are externally connected between the positive electrodes and between the negative electrodes. Thus, a current flowing from the DC power supply to the switching semiconductor chips (IGBTs) via the DC input terminals and a current flowing from the AC output terminals to the DC power supply through the DC input terminals via the semiconductor chips for switching or free wheeling diodes are substantially equally divided to two pairs of the positive and negative DC input terminals and flow therethrough. Thus, the conductor bars reduce, in cooperation with snubber capacitors connected between each pair of the positive and negative DC input terminals, surge voltage caused by stray inductance of the internal wirings between the DC input terminals and the semiconductor chips to half of the surge voltage caused when the conductor bars are not connected externally.

Further, two pairs of the positive and negative terminals of the DC input terminals are positioned on the side edges of the package such that the same polar terminals face to each other, and there exists no obstacle in the wiring paths of the conductor bars. Therefore, the shortest wiring by the straight conductor bars can be made, and it facilitates minimum stray inductance with higher surge suppression effect. In this respect, the shorter the conductor bar is, the smaller the inductance becomes.

DETAILED DESCRIPTION OF A PREFERRED EMBODIMENT

Figure 3A:
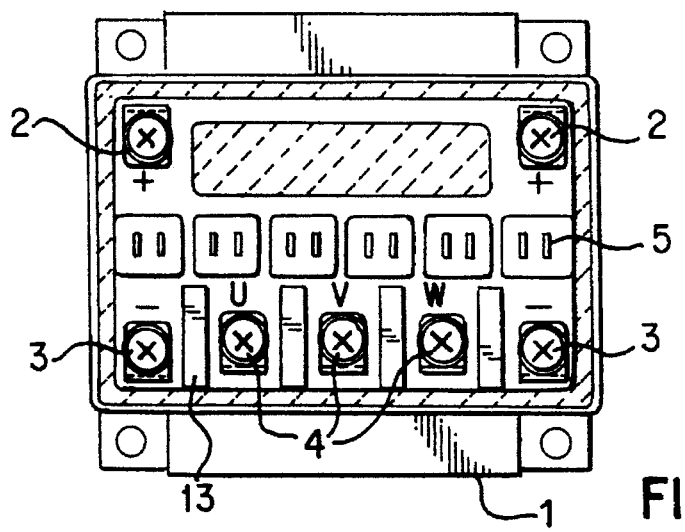
FIG. 3(a) is a plan view of a structure of a package according to the prior art.
Figure 3B:
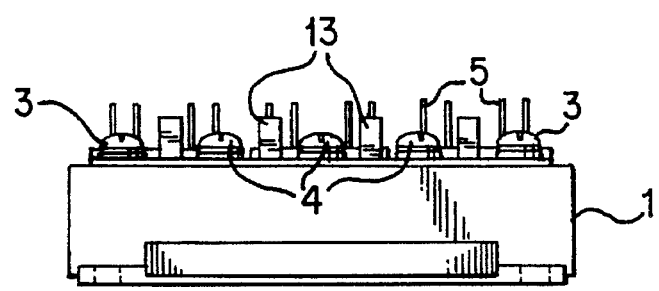
FIG. 3(b) is a front view of the package as shown in FIG. 3(a)
Figure 4:
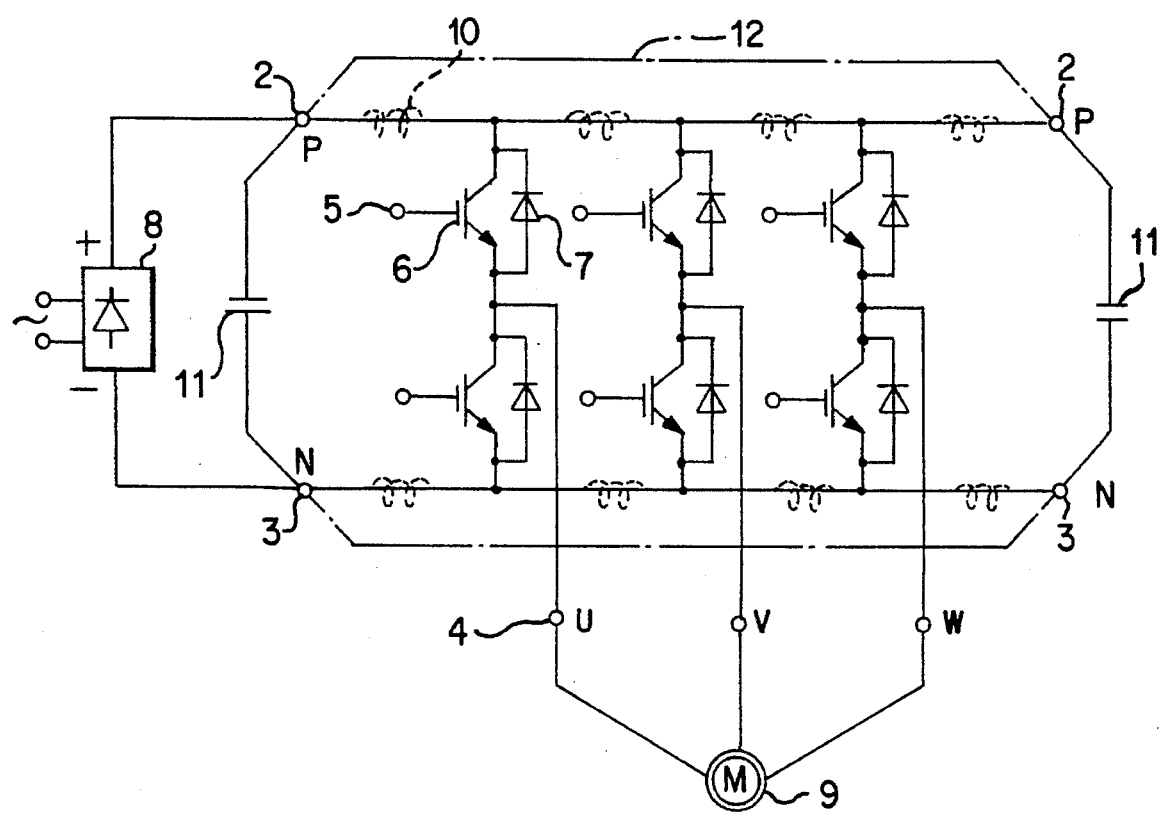
FIG. 4 is a circuit diagram of the internal circuit of the semiconductor device of FIGS. 3(a) and 3(b).

Now the present invention will be described in detail hereinafter with reference to the accompanied drawings which illustrate a preferred embodiment of the present invention. Throughout the drawings, same parts used in FIGS. 3 and 4 are designated by the same reference numerals.

Figure 1A:
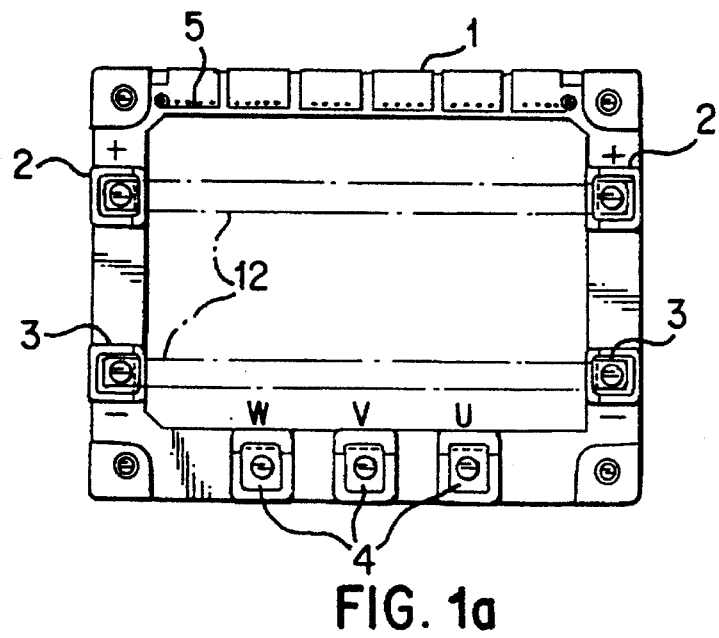
FIG. 1(a) is a plan view of a structure of a package of a semiconductor device according to the present invention.
Figure 1B:
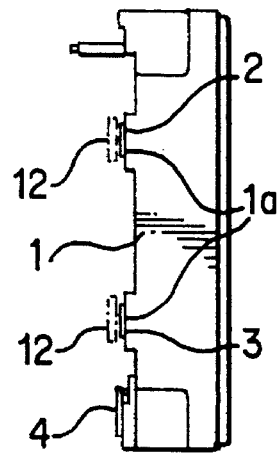
FIG. 1(b) is a side view of the package as shown in FIG. 1(a)
Figure 1C:
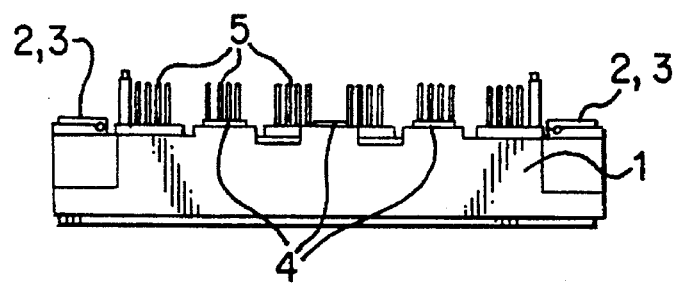
FIG. 1(c) is a front view of the package as shown in FIG. 1(a)

As shown in FIGS. 1(a), 1(b) and 1(c), on two, i.e. right and left, side edges facing to each other in four side edges of a package 1 in a rectangular outer shape, DC input terminals 2, 3 are separately arranged parallel to each other such that one pair of positive and negative terminals is arranged on each side edge and the same polar terminals face to each other. On one side of the remaining side edges, AC output terminals 4 are aligned, and on the other side of the side edges, control terminals 5 are situated. The DC input terminals 2, 3 are positioned on protrusions 1a formed on the peripheral portion of the upper surface to be located one step higher from the central area of the upper surface of the package 1. A bridge circuit formed of six pairs of IGBTs 6 and free wheeling diodes 7 as shown in FIG. 4 is formed in the package 1.

Figure 2:
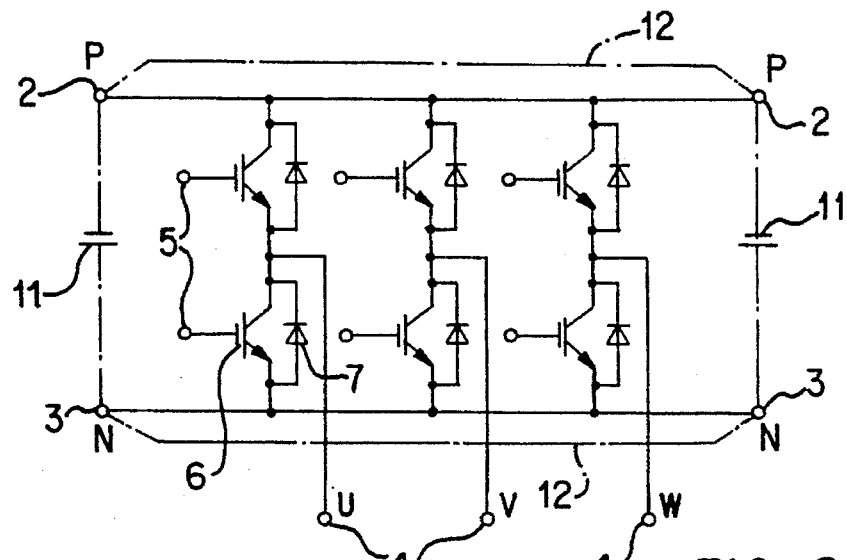
FIG. 2 is a circuit diagram of the internal circuit of the semiconductor device of FIGS. 1(a)–1(c)

When the semiconductor device is used as an inverter, conductor bars 12 are connected linearly between the positive terminals 2, and between the negative terminals 3 on the outer surface of the package 1. Also, snubber capacitors 11 are connected between the positive and negative terminals of the respective pairs, as shown in FIG. 2. By this structure, surge voltage, caused by stray inductance of the internal wirings when the semiconductor device is in switching operation, can be effectively suppressed. As illustrated in FIGS. 1(a)–1(c), there is no obstacle protruding into the wiring paths between the same polar terminals of the DC input terminals 2, 3, so that the same polar terminals can be connected in the shortest way by the straight conductor bars 12, by which higher surge suppression effect is obtained.

As explained above, according to the present invention, in case surge voltage due to the stray inductance of the internal wiring is suppressed in combination with the snubber capacitors and the conductor bars 12 connected between the same polar terminals in the positive and negative terminals of the DC input terminals, it is possible to mutually connect the same polar terminals in the positive and negative terminals of the DC input terminals by the shortest conductor bars without being restricted by other terminals. Thus, high surge suppression effect is obtained. Accordingly, it is possible to easily suppress internal surge voltage in a semiconductor device of large current capacity mounted in a large package in which the internal wiring length becomes long, so that required withstanding voltage of the semiconductor chips need not be too high. Therefore, the characteristics of the semiconductor device, such as to reduce ON voltage, to shorten switching time, to reduce switching loss and so on, can be effectively improved.

What is claimed is:

1. A semiconductor device for converting DC input power to AC output power, comprising:

a package having a rectangular shape and an upper surface thereon, said package including four side edge portions on a periphery of the upper surface with the rectangular shape and containing a plurality of semiconductor chips therein, said four side edge portions being formed of a first pair of parallel side edge portions and a second pair of parallel side edge portions perpendicular to the first pair of the side edge portions, DC input terminals formed of two pairs of positive and negative terminals, each pair formed of one positive terminal and one negative terminal being situated on each side edge portion of the first pair of the parallel side edge portions, respectively; such that the positive terminals on the respective side edge portions directly face to each other and the negative terminals on the respective side edge portions directly face to each other, and AC output terminals and control terminals arranged on the side edge portions in said second pair of the parallel side edge portions.

2. A semiconductor device as claimed in claim 1, further comprising straight conductor bars situated on said upper surface of said package and externally connected between said positive terminals and between said negative terminals such that the conductor bars are arranged parallel to each other.

3. A semiconductor device as claimed in claim 2, wherein said upper surface includes a central area inside the four side edge portions, said DC input terminals being positioned in a plane higher than a plane where the central area of said upper surface is positioned.

4. A semiconductor device as claimed in claim 3, wherein said AC output terminals are located on one side edge portion in the second pair of the parallel side edge portions and said control terminals are located on the other side edge portion in the second pair of the parallel side edge portions so that the AC output terminals and the control terminals face to each other.

5. A semiconductor device as claimed in claim 4, wherein said each pair of the positive and negative electrodes is located in a middle portion of each side edge portion away from corners of the package.

6. A semiconductor device as claimed in claim 1, further comprising snubber capacitors, each being installed between the positive and negative terminals forming one pair.

7. A semiconductor device as claimed in claim 1, wherein said positive terminals of the DC input terminals are internally connected together, and the negative terminals of the DC input terminals are internally connected together.

* * * * *